(12) United States Patent
Goo et al.

(10) Patent No.: US 7,761,823 B2
(45) Date of Patent: Jul. 20, 2010

(54) METHOD FOR ADJUSTING A TRANSISTOR MODEL FOR INCREASED CIRCUIT SIMULATION ACCURACY

(75) Inventors: Jung-Suk Goo, Los Altos, CA (US); Qiang Chen, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 303 days.

(21) Appl. No.: 11/803,646

(22) Filed: May 15, 2007

(65) Prior Publication Data
US 2008/0286887 A1    Nov. 20, 2008

(51) Int. Cl.
*G06F 17/50* (2006.01)
(52) U.S. Cl. .............................. 716/5; 716/4
(58) Field of Classification Search ............ 716/4–6
See application file for complete search history.

(56) References Cited

U.S. PATENT DOCUMENTS

| 2004/0046600 A1* | 3/2004 | Fujimoto et al. ............ 327/518 |
| 2006/0190854 A1* | 8/2006 | Watt .............................. 716/4 |

\* cited by examiner

*Primary Examiner*—Vuthe Siek
(74) *Attorney, Agent, or Firm*—Farjami & Farjami LLP

(57) ABSTRACT

According to one exemplary embodiment, a method for adjusting a transistor model for increased circuit simulation accuracy includes determining a first gate CD offset by matching a C-V test structure having a normalized channel current to an I-V test structure having the normalized channel current. The method further includes utilizing the first gate CD offset to adjust the transistor model for increased circuit simulation. The method also includes determining a second gate CD offset by varying I-V and C-V gate length parameters in the transistor model to cause simulated data from a test circuit to be approximately equal to measured data from the test circuit. The method further includes utilizing the second gate CD offset to adjust the transistor model.

22 Claims, 7 Drawing Sheets

METHOD FOR ADJUSTING A TRANSISTOR MODEL FOR INCREASED CIRCUIT SIMULATION ACCURACY

TECHNICAL FIELD

The present invention is generally in the field of semiconductor device modeling. More particularly, the invention is in the field of transistor modeling.

BACKGROUND ART

Transistor models, such as field effect transistor (FET) models, are critical in achieving reliable performance from circuit designs that include transistors. One significant purpose of a transistor model, such as a Metal-Oxide Semiconductor FET (MOSFET) model, is to verify circuit performance in simulation prior to actual fabrication of the circuit. The accuracy of a transistor model can be determined by how closely circuit simulation results, i.e., the predicted operation of the circuit, approximates circuit data measured from the fabricated circuit. For circuit simulation results to closely approximate measured circuit data, the transistor model requires accurate model parameters, such as current vs. voltage (I-V) and capacitance vs. voltage (C-V) model parameters.

Transistor model parameters, such as I-V and C-V model parameters, can be extracted from I-V and C-V measurements made from respective I-V and C-V test structures. For the extracted I-V and C-V model parameters to accurately predict transistor behavior, it is important that the transistor model include accurate dimensions of the I-V and C-V test structures. In particular, it is important for gate length, which is a gate critical dimension (CD), of the I-V test structure to match the gate length of the C-V test structure in the transistor model. However, process variations, such as variations in gate polysilicon (poly) density, etchant distribution variations during gate etching, and variations in diffraction during photolithographic processing, can cause the fabricated gate lengths of the I-V and C-V test structures to be different. If the transistor model is not adjusted for the difference in gate length between the I-V and C-V test structures, the transistor model may not provide accurate circuit simulation results.

SUMMARY

A method for adjusting a transistor model for increased circuit simulation accuracy, substantially as shown in and/or described in connection with at least one of the figures, and as set forth more completely in the claims.

DETAILED DESCRIPTION OF THE INVENTION

The present invention is directed to a method for adjusting a transistor model for increased circuit simulation accuracy. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
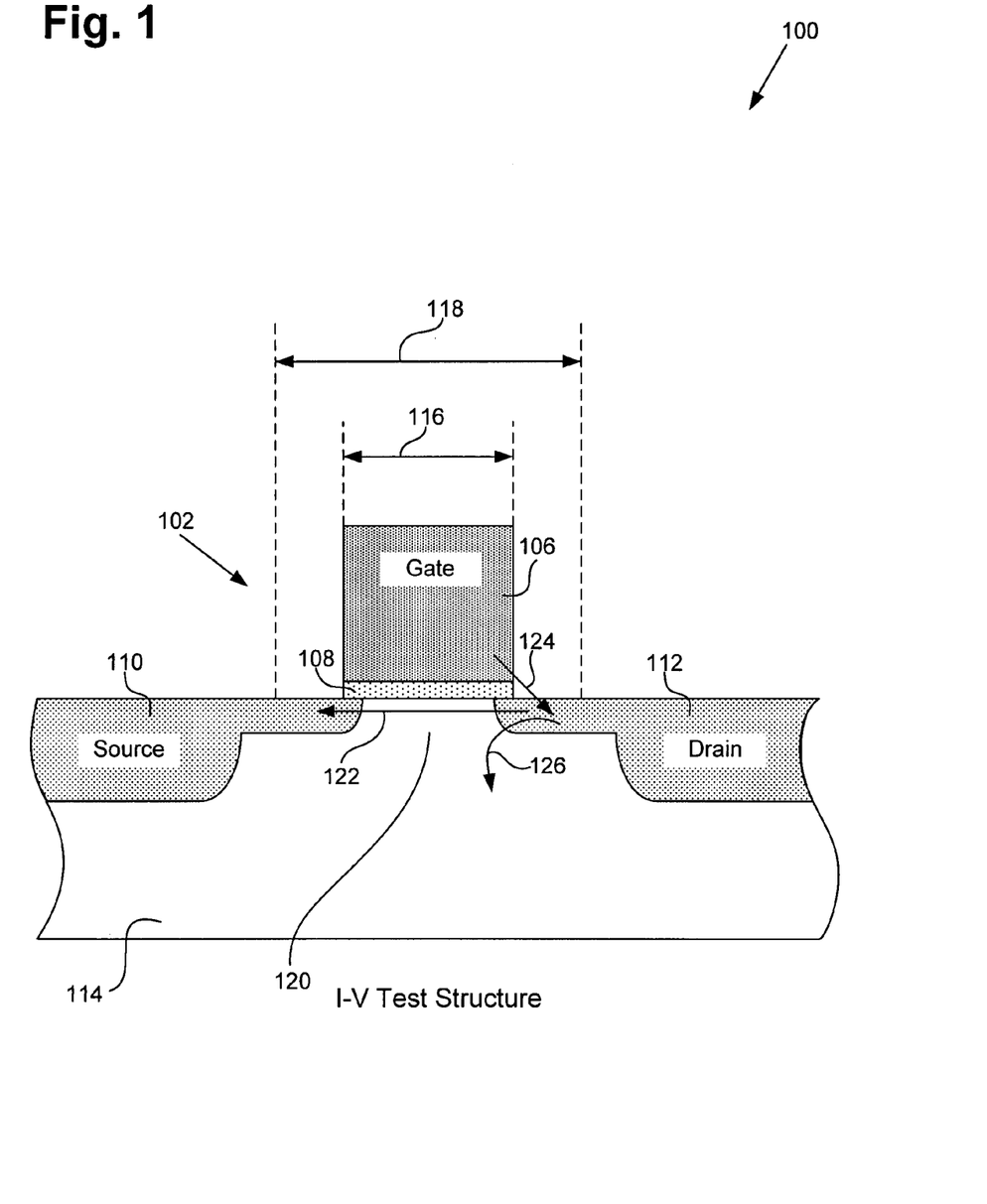
FIG. 1 illustrates a cross-sectional view of exemplary I-V test structure situated on a substrate.

FIG. 1 shows a cross-sectional view of structure 100, which includes an exemplary I-V (current-voltage) test structure situated on a substrate. Structure 100 includes I-V test structure 102, which includes gate 106, gate oxide layer 108, source 110 and drain 112, and substrate 114. I-V test structure 102 is an example of an I-V test structure that can utilized by an embodiment of the present invention to determine a gate CD (critical dimension) offset, which can be utilized to adjust a transistor model to compensate for a relative difference between final gate lengths of I-V and C-V test structures. I-V test structure 102 can be, for example, a FET, such as a MOSFET. Structure 100 can be a portion of a semiconductor wafer that can include a number of I-V test structures, such as I-V test structures 102, and one or more C-V test structures (not shown in FIG. 1).

As shown in FIG. 1, gate 106 is situated over gate oxide 108, which is situated over substrate 114. Gate 106 has final gate length 116, which is the actual physical length of gate 106 after fabrication of structure 100. Drawn gate length 118 refers to the laid-out gate length of gate 106 prior to physical formation on the wafer. Final gate length 116 is typically different than drawn gate length 118 due to intentional overetch and, in particular, systematic process variations, such as variations in gate poly (polysilicon) density, in etchant distribution in the etch process, and in diffraction during the photolithographic process. The value of drawn gate length 118, which is technology dependent, can be, for example, between 60 nanometers (nm) and 65 nm for 65 nm technology. The gate width (not shown in FIG. 1) of gate 106 can be, for example, 10.0 microns or less. The gate width is generally determined by the "active mask," and "gate width" as used in the present application is also referred to as "active width," "channel width," and "transistor width" in the art.

Also shown in FIG. 1, source 110 and drain 112 are situated in substrate 114 under respective sides of gate 106 and channel region 120 is situated in substrate 114 between source 110 and drain 112. Channel current 122, which flows between drain 112 and source 110, is dependent on final gate length 116 and can be measured from source 110 or drain 112 of I-V test structure 102. However, in addition to channel current, drain current also includes parasitic currents, such as gate tunneling current 124 and gate induced drain leakage (GIDL)

and impact ionization currents 126. Since source current does not include the parasitic currents discussed above, it (i.e. source current) more accurately corresponds to channel current 122 compared to drain current. As a result, in the present invention, source current can be utilized to represent channel current and to determine a relative difference in final gate length between I-V and C-V test structures.

Figure 2:
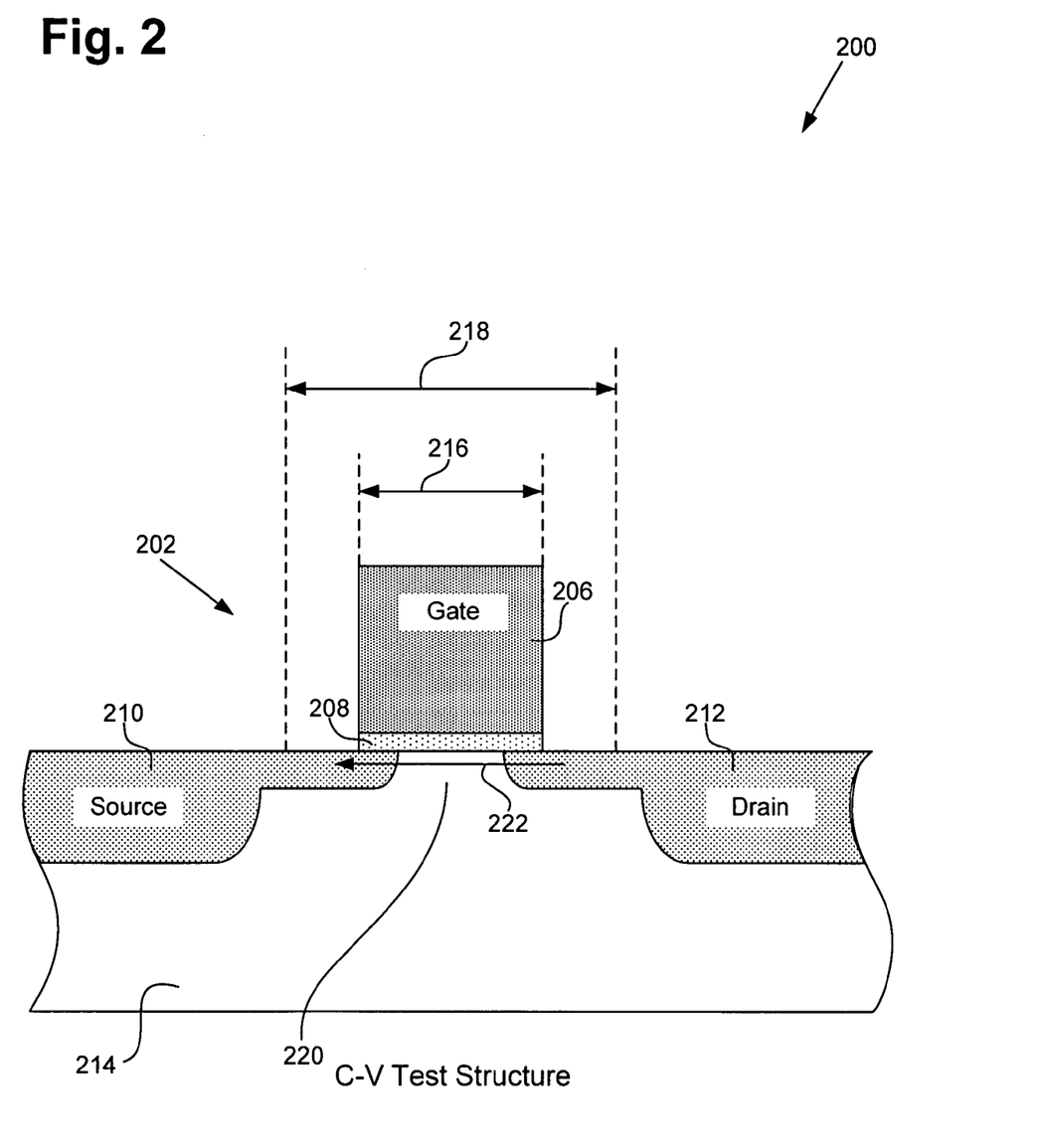
FIG. 2 illustrates a cross-sectional view of exemplary C-V test structure situated on a substrate.

FIG. 2 shows a cross-sectional view of structure 200, which includes an exemplary C-V (capacitance-voltage) test structure situated on a substrate. Structure 200 includes C-V test structure 202, which includes gate 206, gate oxide layer 208, source 210 and drain 212, and substrate 214, which corresponds to substrate 114 in FIG. 1. C-V test structure 202 can be utilized by an embodiment of the present invention to determine a gate CD offset corresponding to a different in final gate length between I-V and C-V test structures. C-V test structure 202 can be, for example, a FET, such as a MOSFET. Structure 200 can be a portion of a semiconductor wafer that can also include a number of I-V test structures, such as I-V test structures 102 in FIG. 1.

As shown in FIG. 2, gate 206 is situated over gate oxide 208, which is situated over substrate 214. Gate 206 has final gate length 216, which is the physical length of gate 206 after fabrication of structure 200. Drawn gate length 218 refers to the laid out gate length of gate 206 prior to actual formation on the wafer. Final gate length 216 is typically different than drawn gate length 218 due to intentional overetch and similar systematic process variations that can affect the final gate length of I-V test structure 102 discussed above. Similar to drawn gate length 118 in structure 100, the size of drawn gate length 218 is also dependent on the particular technology utilized. The width (not shown in FIG. 2) of gate 206 must be sufficiently large to achieve reliable C-V measurements. For the same approximate drawn gate length, the width of gate 206 can be orders in magnitude larger than the width of gate 106 in I-V test structure 102. Also shown in FIG. 2, source 210 and drain 212 are situated in substrate 214 under respective sides of gate 206 and channel region 220 is situated in substrate 214 between source 210 and drain 212.

C-V test structure 202 can typically be utilized to measure C-V characteristics, which can be utilized to extract C-V parameters for a transistor model, such as a FET model. The FET model, such as a MOSFET model, can be a "SPICE" (Simulation Program for Integrated Circuits Emphasis) model, for example. "SPICE" refers to a general purpose circuit simulator that is used in the art to verify circuit designs and to predict circuit behavior.

Channel current that flows between source and drain of a FET, such as I-V test structure 102, when the FET is turned on or off, i.e., when the FET is in an on-state or an off-state, can be referred to respectively as "channel on-current" or "channel off-current." When channel on-current is measured, it (i.e. channel on-current) can cause a significant IR drop across a measuring probe for structures with large gate width, such as C-V structure 202 in FIG. 2, which undesirably affects the accuracy of the channel on-current measurement. However, since channel off-current is much smaller than channel on-current, it (i.e. channel off-current) can be measured without causing a significant IR drop across the measuring probe. Channel off-current is proportional to gate width and proportional to the exponential of threshold voltage. The gate width is generally determined by the "active mask," and "gate width" as used in the present application is also referred to as "active width," "channel width," and "transistor width" in the art.

In the invention, channel off-current is determined by measuring source off-current ($I_{Soff}$), which refers to the current that flows through the source of the FET when the FET is turned off, i.e., in the off-state. In an embodiment of the invention, $I_{Soff}$ can be measured with gate-to-source voltage (Vgs) equal to approximately 0.0 volts and drain-to-source voltage (Vds) equal to Vdd, which is dependent on the particular technology utilized. For example, in 65.0 nm technology, Vdd can be less than 1.5 volts. In an embodiment of the invention's method discussed below in relation to FIG. 3, $I_{Soff}$ can be utilized to determine a gate CD offset corresponding to the relative difference in final gate length between I-V and C-V test structures.

In the present invention, a C-V test structure, such as C-V test structure 202, can be utilized to measure $I_{Soff}$ (source off-current), which corresponds to channel current 222 when C-V test structure 202 is turned off, i.e., in an off-state. In an embodiment of the invention, $I_{Soff}$ can be measured for a C-V test structure, such as C-V test structure 202, with Vgs (gate-to-source voltage) equal to approximately 0.0 volts and Vds (drain-to-source voltage) equal to Vdd, which can be, for example, less than approximately 1.5 volts.

Even though drawn gate length 218 of gate 206 in C-V test structure 202 can be substantially the same as drawn gate length 118 of gate 106 in I-V test structure 102, final gate length 216 of gate 206 can be different than final gate length 116 of gate 106 as a result of systematic process variations, as discussed above. If not compensate for in a transistor model, such as a SPICE MOSFET model, the above discussed difference between final gate lengths of the I-V and C-V test structures can cause the transistor model to inaccurately predict circuit behavior during circuit simulation. As will be discussed below in relation to FIG. 3, the present invention provides a method for adjusting a transistor model, such as a FET model, to compensate for a different in final gate length of I-V and C-V test structures. In the method of the invention, the transistor model can be further adjusted to compensate for a difference in final gate length between the I-V and C-V test structures and a test circuit structure, thereby increasing circuit simulation accuracy.

Figure 3:
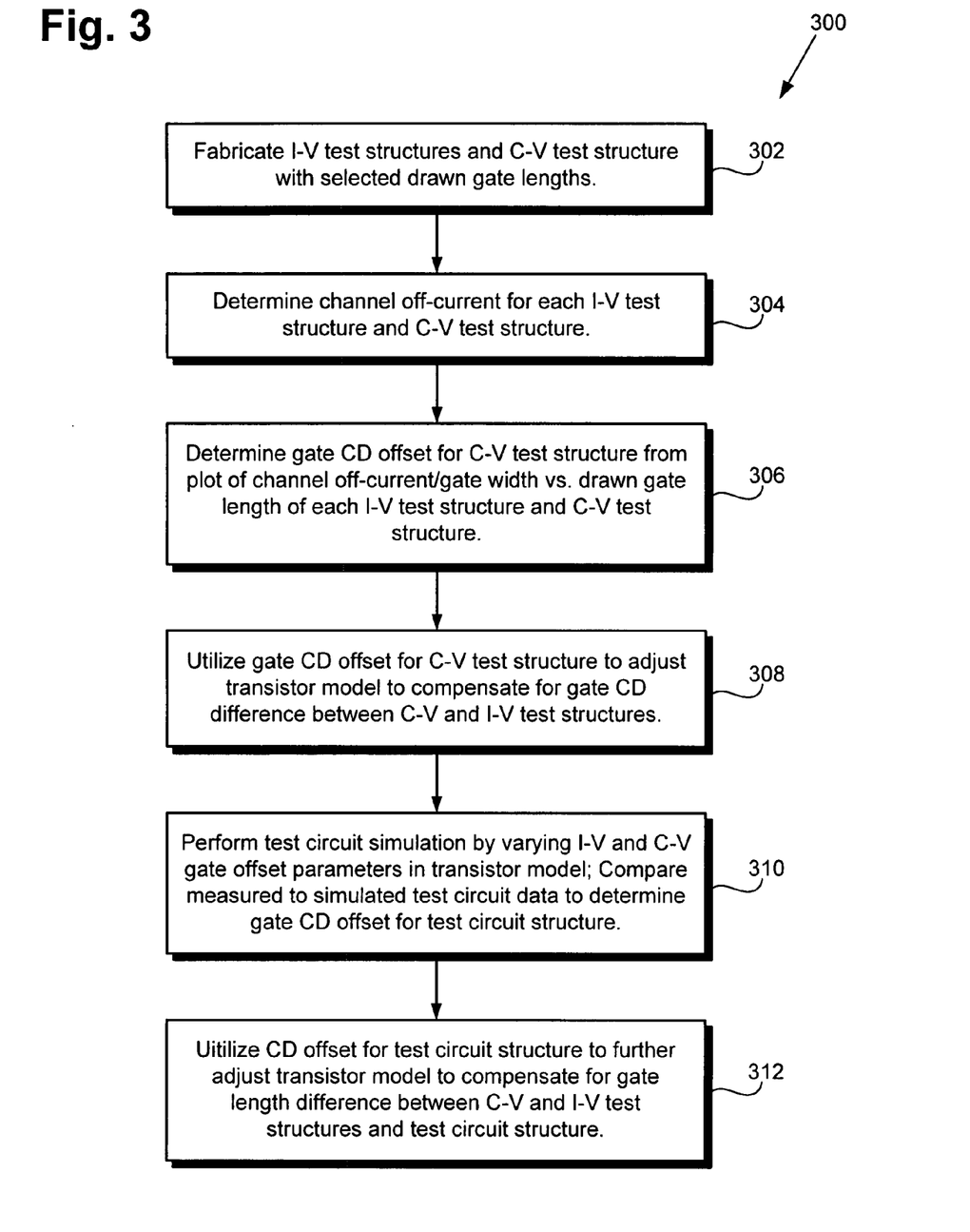
FIG. 3 shows a flowchart illustrating typical steps taken to implement an embodiment of the present invention.

FIG. 3 shows a flowchart illustrating a method for adjusting a transistor model, such as a FET model, for increased circuit simulation accuracy in accordance with one embodiment of the present invention. Certain details and features have been left out of flowchart 300 that are apparent to a person of ordinary skill in the art. For example, a step may consist of one or more substeps or may involve specialized equipment or materials, as known in the art. While steps 302, 304, 306, 308, 310, and 312 indicated in flowchart 300 are sufficient to describe one embodiment of the present invention, other embodiments of the invention may utilize steps different from those shown in flowchart 300.

Referring now to step 302 in FIG. 3, at step 302 of flowchart 300, a desired number of I-V test structures, such as I-V test structure 102 in FIG. 1, and a C-V test structure, such as C-V test structure 202 in FIG. 2, are fabricated with selected drawn, i.e., laid-out, gate lengths on a wafer substrate, such as substrate 114. In one embodiment, more than one C-V test structure can be fabricated. The drawn gate length of the C-V test structure, such as drawn gate length 218 of C-V test structure 202, can be selected to be approximately equal to a desire minimum final gate length. The drawn gate length of the C-V test structure may be equal to, for example, approximately 60.0 nm. The drawn gate length of one of the I-V test structures, such as drawn gate length 118 of I-V test structure 102, can be selected to be substantially equal to the drawn gate length of the C-V test structure. Some I-V test structures can have selected drawn gate lengths that are shorter than the drawn gate length of the C-V test structure and other I-V test structures can have selected drawn gate lengths that are longer than the drawn gate length of the C-V test structure.

At step 304 of flowchart 300, channel off-current is determined for each I-V test structure and the C-V test structure. In the present embodiment, channel off-current is determined by measuring $I_{Soff}$ (source off-current) for each I-V and C-V test structure, where Vgs (gate-to-source voltage) is substantially equal to 0.0 and Vds (drain-to-source voltage) is substantially equal to Vdd for each test structure. At step 306 of flowchart 300, the gate CD offset, which corresponds to a gate CD difference between the C-V test structure and an I-V test structure having substantially the same $I_{Soff}$ (source off-current)/gate width (W), is determined from a plot of $I_{Soff}$/W vs. drawn gate length for the I-V test structures and the C-V test structure. In the present application, $I_{Soff}$ (source off-current)/gate width (W) can also be referred to as "normalized source off-current."

The gate CD offset can be determined by plotting $I_{Soff}$/W, which corresponds to a channel off-current that has been normalized by gate width, i.e., a normalized channel off-current, vs. drawn gate length, i.e., laid-out gate length, for the C-V test structure and the I-V test structures. An $I_{Soff}$/W curve can be drawn through the data points on the plot corresponding to respective I-V test structures, which each have a different drawn gate length. A line can then be drawn through the data point on the plot corresponding to the C-V test structure so as to intersect the $I_{Soff}$/W curve of the I-V test structures at a point corresponding to an I-V test structure having substantially the same $I_{Soff}$/W value as the C-V test structure. The gate CD offset can then be determining by the difference between the drawn gate length of the C-V test structure and the drawn gate length of the I-V test structure having substantially the same value of $I_{Soff}$/W. For example, if the C-V test structure has a drawn gate length of 60.0 nm and the I-V test structure determined from the plot has a drawn gate length of 58.5 nm, the gate offset would be 1.5 nm.

At step 308 of flowchart 300, the gate CD offset determined at step 306 of flowchart 300 is utilized to adjust a transistor model, such as a FET model, to compensate for the gate CD difference between I-V and C-V test structures, thereby increasing circuit simulation accuracy. In the present embodiment, the gate CD offset can be utilized to adjust a C-V gate length parameter, such as a C-V gate length offset parameter, in the transistor model. For example, if the drawn gate length of the C-V test structure is larger than the drawn gate length of the I-V test structure used to determine the gate CD offset, the gate CD offset can be added to the C-V gate length offset parameter in the transistor model. For a transistor model such as a SPICE BSIM (Berkeley Short-Channel IGFET Model), the gate CD offset can be added to the dlc parameter, which is the C-V gate length adjustment parameter in the SPICE BSIM. In one embodiment, the gate CD offset can be utilized to adjust an I-V gate length parameter, such as an I-V gate length offset parameter, in the transistor model. For example, for the SPICE BSIM, the gate CD offset can be subtracted from the lint parameter, which is the I-V gate length offset parameter in the SPICE BSIM.

At step 310 of flowchart 300, a test circuit simulation can be performed by varying the I-V and C-V gate length offset parameters in the adjusted transistor model to generate simulated test circuit data. The simulated test circuit data can be compared to measured test circuit data to determine a gate CD offset for a test circuit structure. In the present embodiment, the test circuit can be a ring oscillator including an odd number of inverters, where each inverter can comprise a pair of FETs and can have a fan-out equal to one. For example, the ring oscillator can include three inverters, which can be coupled together to form a ring. In another embodiment, a circuit other than a ring oscillator can be utilized as a test circuit.

In the present embodiment, ring oscillator delay per stage, i.e., switching delay of the ring oscillator per inverter, can be compared to current drawn from the power supply by the ring oscillator when the ring oscillator is operating, which can be referred to as dynamic Icc. The delay of the ring oscillator is proportional to capacitance divided by channel on-current and dynamic Icc is proportional to channel on-current. Both the delay of the ring oscillator and the dynamic Icc are also proportional to gate length. Simulated delay vs. dynamic Icc can be plotted on a graph by incrementally varying both the I-V and C-V gate length offset parameters in the transistor model, which was previously adjusted to compensate for a difference in I-V and C-V final gate lengths. Delay vs. dynamic Icc can be measured from a number of fabricated ring oscillators, i.e., ring oscillator structures, having different drawn gate lengths and plotted as measured data on the graph. A gate CD offset for the ring oscillator structure can be determined by adjusting the I-V and C-V gate length offset parameters of the transistor model so as to cause the simulated delay vs. dynamic Icc data to closely approximate, i.e., to be approximately equal to, the median of the measured delay vs. dynamic Icc data.

At step 312 of flowchart 300, the gate CD offset for the ring oscillator structure determined at step 310 of flowchart 300 is utilized to further adjust the transistor model to compensate for a final, i.e., fabricated, gate length difference between C-V and I-V test structures and the ring oscillator structure. For example, the transistor model can be further adjusted by adding the gate CD offset for the ring oscillator structure to both of the I-V and C-V gate length offset parameters of the transistor model. A simulation can be performed to verify that the transistor model with I-V and C-V gate length offset parameters adjusted with the gate CD offset for the ring oscillator structure causes simulated delay vs. dynamic Icc data to approximately equal to the median of the measured delay vs. dynamic Icc data.

Thus, as discussed above, by utilizing a first gate CD offset to adjust a transistor model to compensate for a difference between final gate lengths of I-V and C-V test structures, and by utilizing a second gate CD offset to further adjust the transistor model to compensate for a difference between the final gate lengths of the I-V and C-V test structures and a test circuit structure, the invention advantageously achieves a transistor model, such as a FET model, that provides increased circuit simulation accuracy.

In one embodiment, the invention's method can include manufacturing a semiconductor product according to a transistor model after the transistor model has been adjusted according to step 308 of flowchart 300 in FIG. 3. In another embodiment, the invention's method can include assembling a semiconductor product onto a circuit board, where the semiconductor product has been manufactured according to a transistor model after the transistor model has been adjusted according step 308 of flowchart 300.

Figure 4:
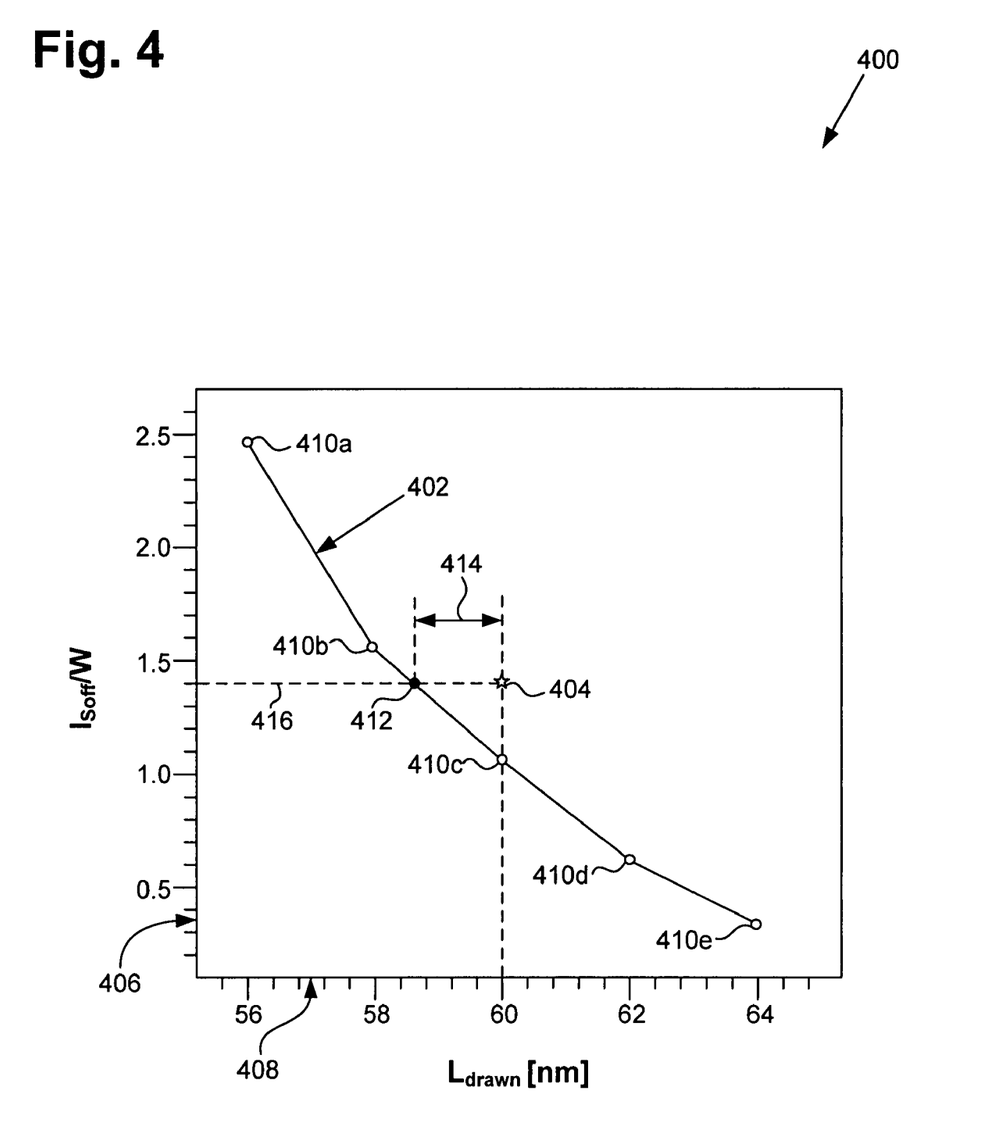
FIG. 4 is a graph showing an exemplary $I_{Soff}$ (source off-current)/W (gate width) curve corresponding to a number of I-V test structures and an exemplary $I_{Soff}$/W data point corresponding to an exemplary C-V test structure in accordance with one embodiment of the present invention.

FIG. 4 shows graph 400 including $I_{Soff}$/W curve 402 for I-V test structures and $I_{Soff}$/W data point 404 for a C-V test structure in accordance with one embodiment of the present invention. Graph 400 also includes $I_{Soff}$/W axis 406 and drawn gate length ($L_{drawn}$) axis 408. In the example shown in graph 400, $I_{Soff}$/W curve 402 includes data points 410a, 410b, 410c, 410d, and 410e, which indicate measure values of $I_{Soff}$/W for I-V test structures having respective drawn gate lengths of 56.0 nm, 58.0 nm, 60.0 nm, 62.0 nm, and 64.0 nm. In the example shown in graph 400, $I_{Soff}$/W data point 404 (represented by a star) indicates a measured value of $I_{Soff}/W$ for a single C-V test structure having a drawn gate length substantially equal to 60.0 nm.

Except for very small values of gate width (W), $I_{Soff}/W$ does not significantly change with increasing gate width. However, $I_{Soff}/W$ is inversely proportion to gate length. In the example shown in graph 400, a line 416, which is drawn through $I_{Soff}/W$ data point 404 and extends parallel to $L_{drawn}$ axis 408, can intersect $I_{Soff}/W$ curve 402 at data point 412, which corresponds to an I-V test structure having a drawn gate length substantially equal to 58.5 nm and the same value of $I_{Soff}/W$ as the C-V test structure at data point 404. Thus, $I_{Soff}/W$ of the C-V test structure having a drawn gate length substantially equal to 60.0 nm matches the $I_{Soff}/W$ of an I-V test structure having a drawn gate length substantially equal to 58.5 nm.

Thus, distance 414 corresponds to the gate CD difference between I-V and C-V test structures having the same value of $I_{Soff}/W$. Distance 414 can be substantially equal to 1.5 nm, which is the difference between 60 nm, i.e., the drawn gate length of the C-V test structure, and 58.5 nm, i.e., the drawn gate length of the I-V test structure having the same $I_{Soff}/W$. The gate CD offset determined above can be utilized to adjust the C-V gate CD adjustment parameter in a transistor model, such as a FET model, to compensate for a difference in final, i.e., fabricated, gate length between I-V and C-V test structures.

Figure 5:
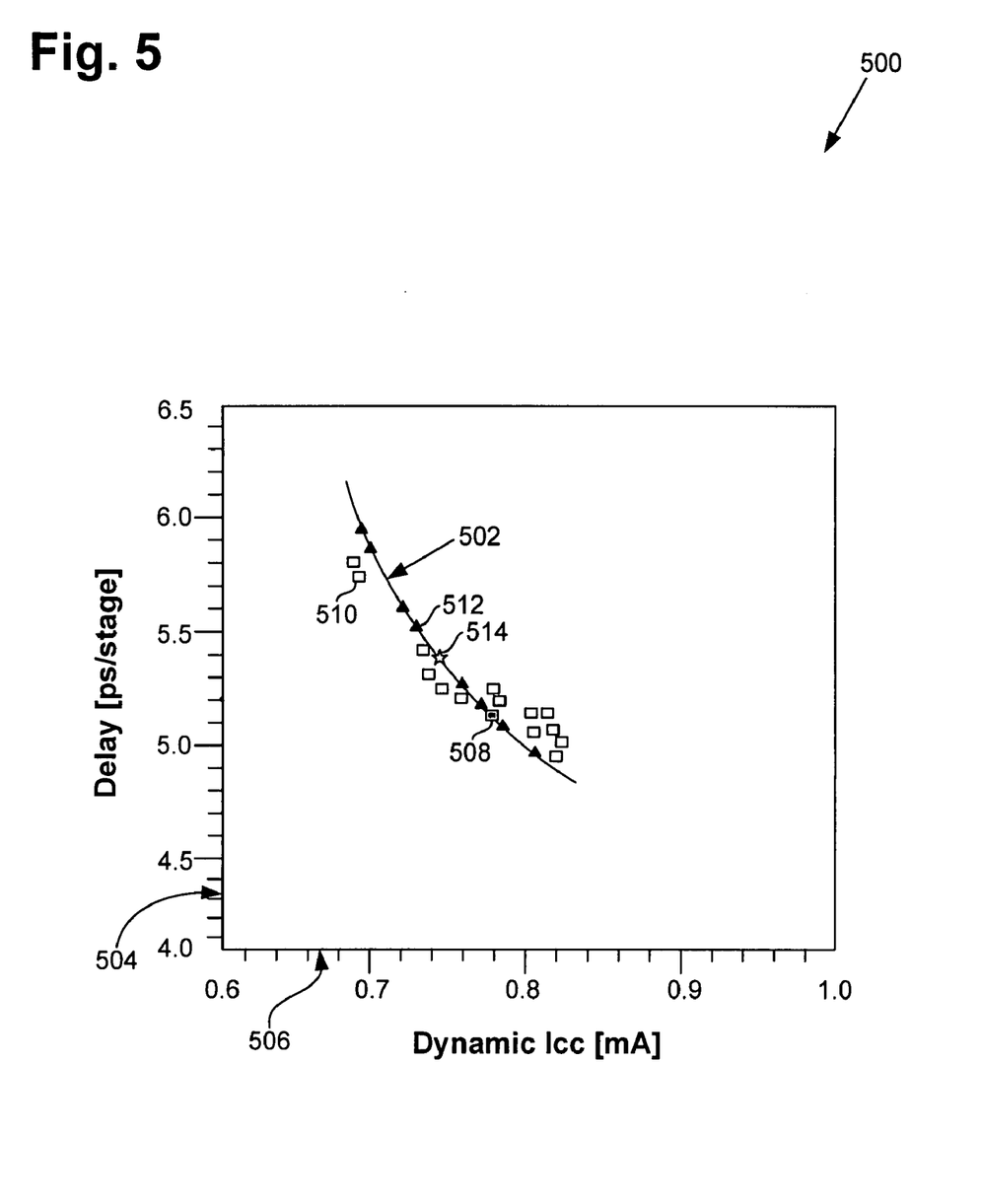
FIG. 5 is a graph showing an exemplary simulated ring oscillator delay curve and exemplary measured ring oscillator delay data in accordance with one embodiment of the present invention.

FIG. 5 shows graph 500 including simulated ring oscillator delay curve 502 and measured data median 508 for determining a gate CD offset for a ring oscillator structure in accordance with one embodiment of the present invention. Graph 500 also includes delay axis 504, which indicates a range of ring oscillator delay in picoseconds per stage, and dynamic Icc axis 506, which indicates a range of dynamic current drawn by the ring oscillator in milliamperes. In the example shown in graph 500, simulated ring oscillator delay curve 502 includes simulated data points, such as simulated data point 512, which have a triangular shape, and simulated data point 514, which is star-shaped. In the example shown in graph 500, the triangular-shaped simulated data points, such as simulated data point 512, which correspond to simulated delay vs. dynamic Icc of a ring oscillator, are determined by incrementally varying I-V and C-V gate length offset parameters in a transistor model, such as a FET model, in a ring oscillator simulation.

In the example shown in graph 500, simulated data point 514 corresponds to the simulated delay vs. dynamic Icc of a ring oscillator determined by utilizing the C-V gate length offset parameter adjusted to compensate for a difference in final gate length between I-V and C-V test structures in the transistor model. In the example shown in graph 500, measured data point, such as measured date point 510, which are indicated by white squares, correspond to measured delay vs. dynamic Icc of ring oscillator structures having different respective gate lengths. Measured data median 508, which is indicated by a dark square, corresponds to the median of data points such as data point 510.

In the example shown in graph 500, a gate CD offset for the ring oscillator structure can be determined by the amount that the I-V and C-V gate length offset parameters of the transistor model corresponding to simulated data point 514 having to be adjusted to cause the simulated delay vs. dynamic Icc data to closely approximate measured data median 508. The gate CD offset for the ring oscillator can then be utilized to adjust the I-V and C-V gate length offset parameters of the transistor model to compensate for a final gate length difference between I-V and C-V test structures and the ring oscillator structure.

Figure 6:
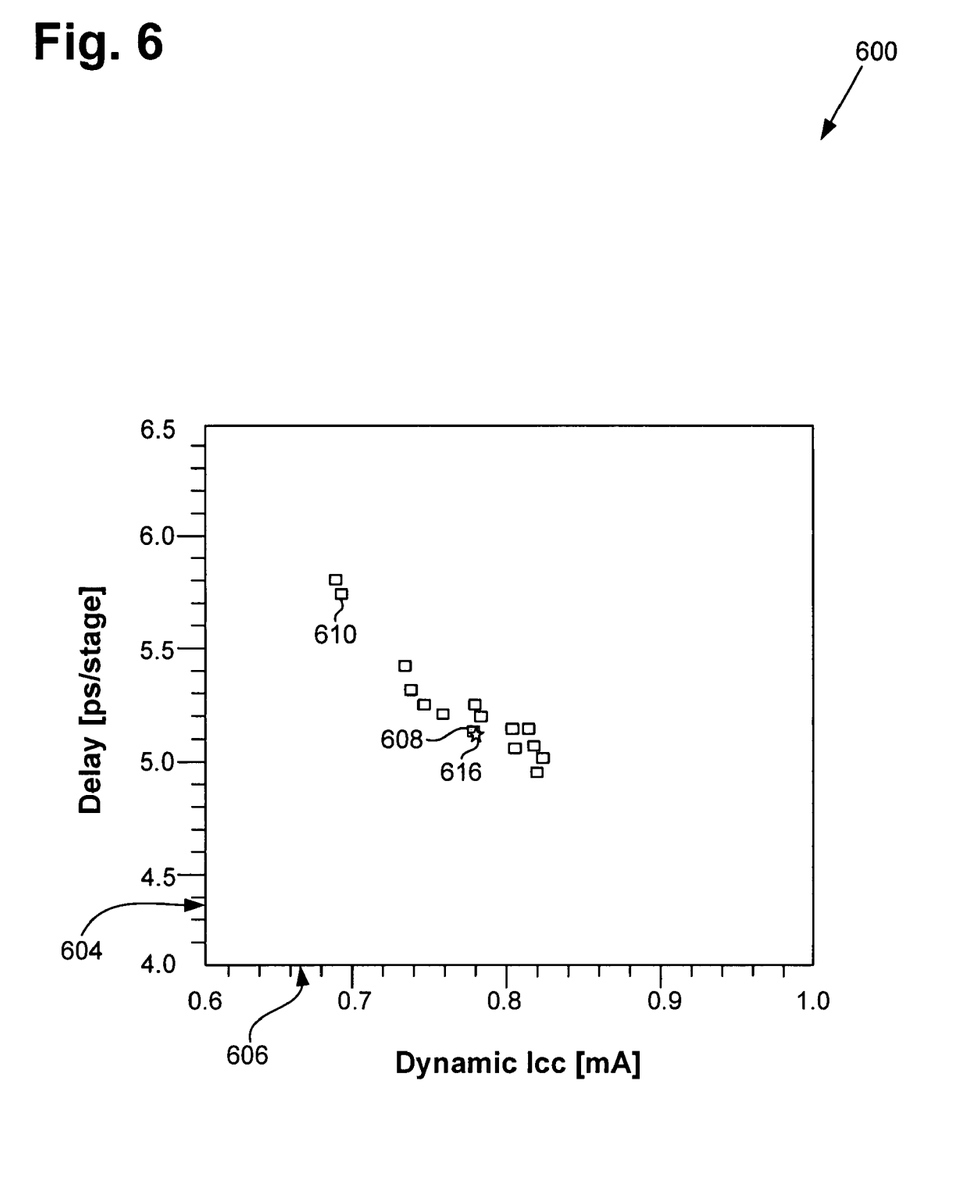
FIG. 6 is a graph showing an exemplary simulated ring oscillator delay data point and an exemplary measured ring oscillator delay data median in accordance with one embodiment of the present invention.

FIG. 6 shows graph 600 including simulated data point 616 and median data point 608 in accordance with one embodiment of the present invention. In graph 600, delay axis 604, dynamic Icc axis 606, measured data median 608, and measured data point 610, correspond, respectively, to delay axis 504, dynamic Icc axis 506, measured data median 508, and measured data point 510 in graph 500 in FIG. 5. In the example shown in graph 600, simulated data point 616 corresponds to simulated delay vs. dynamic Icc of a ring oscillator as determined by adjusting the I-V and C-V gate length offset parameters in a transistor model by using a gate offset for a ring oscillator structure as determined in the example of graph 500 shown in FIG. 5. As shown in graph 600, simulated data point 616 is approximately equal to measured data median 608. Thus, by adjusting I-V and C-V gate length offset parameters in a transistor model to compensate for a difference in final gate length between I-V and C-V test structures and a ring oscillator test structure, the present invention achieves a transistor model, such as a FET model, that can provide simulated data results for a test circuit, such as a ring oscillator, that closely approximates data measured from the ring oscillator structure.

Figure 7:
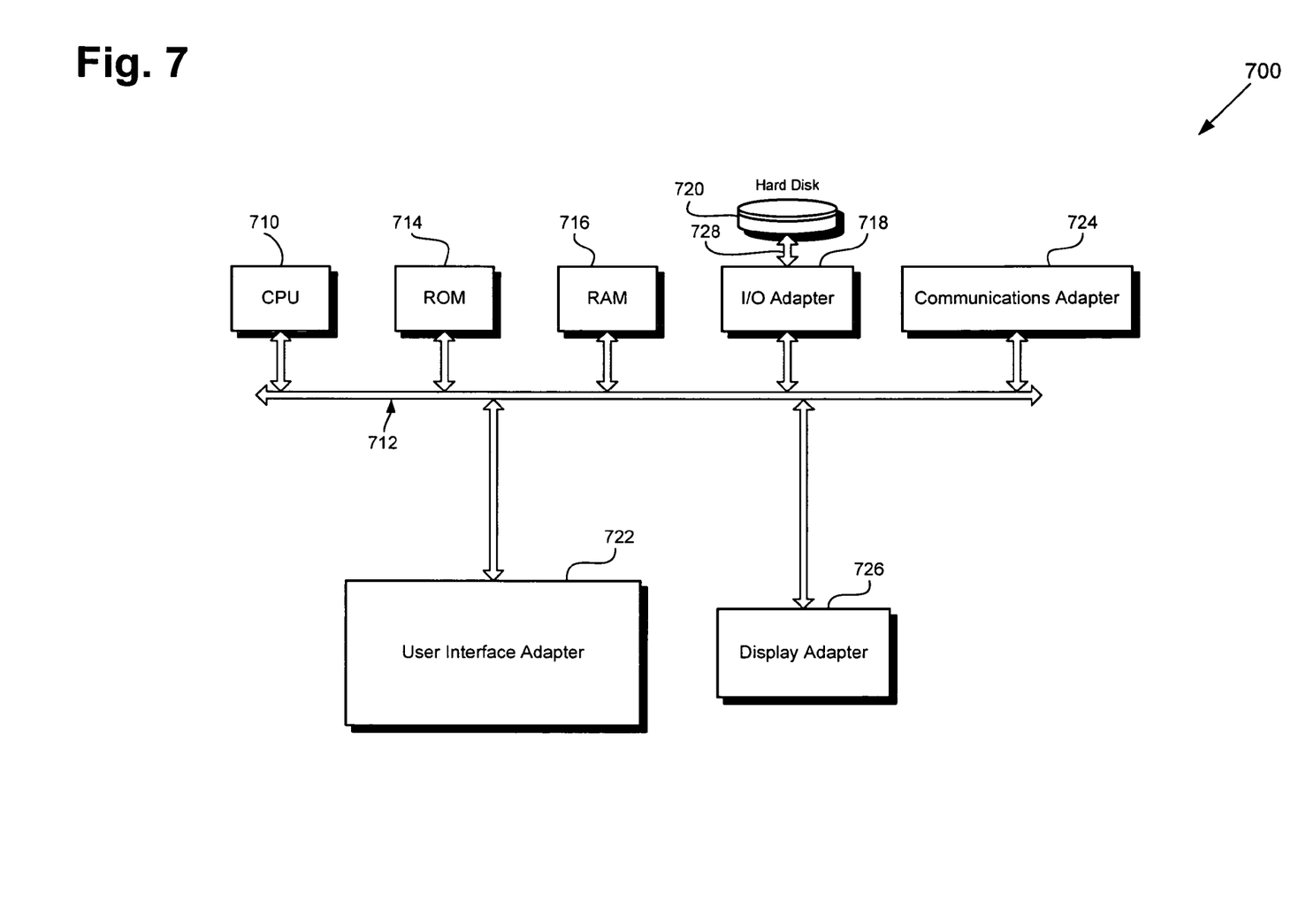
FIG. 7 shows a block diagram of an exemplary programmed computer which can be utilized to implement an embodiment of the present invention's method.

FIG. 7 shows computer 700 for implementing a method for producing a quality assured semiconductor device model in accordance with one embodiment of the present invention. For the purpose of an example, computer 700 shows a typical computer which can be programmed to run the invention's method for adjusting a transistor model to compensate for final gate length differences between I-V and C-V test structures and between the I-V and C-V test structures and a test circuit structure illustrated in flowchart 300 in FIG. 3. Computer 700 (also referred to as "programmed computer") includes central processing unit (CPU) 710, bus 712, read only memory (ROM) 714, random access memory (RAM) 716, input/output (I/O) adapter 718, hard drive 720, user interface adapter 722, communications adapter 724, and display adapter 726. Computer 700 can also include a compact disk (CD), a digital video disk (DVD), and a flash memory storage device, which are not shown in FIG. 7, as well as other computer-readable media as known in the art.

As shown in FIG. 7, CPU 710, ROM 714, RAM 716, I/O adapter 718, communications adapter 724, user interface adapter 722, and display adapter 726 are coupled to bus 712, which provides a communications conduit for the above devices. User interface adapter 722 is typically coupled to an input device such as a keyboard (not shown in FIG. 7) to permit a user to communicate with and control the computer. Display adapter 726 is typically coupled to a monitor (not shown in FIG. 7) for the purpose of communicating and interacting with the user. Also shown in FIG. 7, hard disk 720 is coupled to I/O adapter 718 via bus 728, which allows hard disk 720 and I/O adapter 718 to communicate.

In computer 700, program code (also referred to simply as "code") for executing the invention's method for adjusting a transistor model for increased circuit simulation accuracy, such an embodiment of the invention's method shown in flowchart 300 in FIG. 3, can be contained in a computer-readable medium such as ROM 714, RAM 716, hard disk 720, a CD (not shown in FIG. 7), a DVD (not shown in FIG. 7), or a flash memory storage device (not shown in FIG. 7), for example.

Computer 700 shown in FIG. 7 may be a work station, for example, which uses a 32-bit, 64-bit, a dual-core, or a multi-core CPU, as known in the art. Computer 700 can be a personal computer, a mini-computer, or a mainframe as well. However, it is understood and appreciated by those skilled in the art that the invention's method of producing a quality assured semiconductor device model may also be implemented using a variety of different types of computers other than those specifically mentioned herein.

As discussed above, the present invention provides a method increasing circuit simulation accuracy of a transistor model, such as a FET model, including determining a first gate offset by matching normalized source off-current of a C-V test structure to an I-V test structure having the same normalized source off-current. In an embodiment of the invention's method, the first gate offset can be utilized to adjust a C-V gate length offset parameter in the transistor model, thereby compensating for a difference in final gate length between I-V and C-V test structures. In an embodiment of the invention's method, a second gate CD offset can be determining by adjusting I-V and C-V gate length offset parameters during simulation of a test circuit, such as a ring oscillator, to cause simulated test circuit data to be approximately equal to measured test circuit date. The second gate CD offset can be utilized to adjust the I-V and C-V gate length offset parameters in the transistor model to compensate for a difference in final gate length between the I-V and C-V test structures and a test circuit structure, thereby advantageously increasing circuit simulation accuracy by causing circuit simulation data to more closely approximate measured circuit data.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for adjusting a transistor model for increased circuit simulation accuracy has been described.

The invention claimed is:

1. A method for use by a circuit simulation system for adjusting a transistor model for increased circuit simulation accuracy, said method comprising the steps of:
    determining a first gate critical dimension (CD) offset by matching a C-V test structure having a normalized channel current to an I-V test structure having said normalized channel current, said first gate CD offset corresponding to a difference between a final gate length of said C-V test structure and a final gate length of said I-V test structure, said determining performed by said circuit simulation system;
    utilizing said first gate CD offset by said circuit simulation system to adjust said transistor model for said increased circuit simulation accuracy.

2. The method of claim 1 further comprising determining a second gate CD offset by varying I-V and C-V gate length parameters in said transistor model to cause simulated data from a test circuit to be approximately equal to measured data from said test circuit.

3. The method of claim 2 further comprising utilizing said second gate CD offset to adjust said transistor model.

4. The method of claim 3, wherein said transistor model is adjusted by adding said second gate CD offset to said I-V and C-V gate length parameters in said transistor model.

5. The method of claim 2, wherein, said test circuit comprises a ring oscillator.

6. The method of claim 2, wherein said measured data from said test circuit is determined by measuring a delay corresponding to a power supply current of said ring oscillator.

7. The method of claim 1, wherein said normalized channel current is determined by dividing a source off-current by a gate width.

8. The method of claim 1, wherein said transistor model is adjusted by adding said first gate CD offset to a C-V gate length parameter in said transistor model.

9. The method of claim 1, wherein said transistor model is a FET model.

10. The method of claim 9, wherein said FET model is a SPICE MOSFET model.

11. The method of claim 1 further comprising manufacturing a semiconductor product according to said transistor model after said transistor model has been adjusted.

12. The method of claim 11 further comprising assembling said semiconductor product onto a circuit board.

13. A programmed computer for executing code for adjusting a transistor model for increased circuit simulation accuracy, said programmed computer including a computer storage device, a central processing unit (CPU), and a user interface adapter, said programmed computer executing said code to implement a method comprising the steps of:
    determining a first gate critical dimension (CD) offset by matching a C-V test structure having a normalized channel current to an I-V test structure having said normalized channel current, said first gate CD offset corresponding to a difference between a final gate length of said C-V test structure and a final gate length of said I-V test structure;
    utilizing said first gate CD offset to adjust said transistor model for said increased circuit simulation accuracy.

14. The programmed computer of claim 13, wherein said method further comprises determining a second gate CD offset by varying I-V and C-V gate length parameters in said transistor model to cause simulated data from a test circuit to be approximately equal to measured data from said test circuit.

15. The programmed computer of claim 14, wherein said method further comprises utilizing said second gate CD offset to adjust said transistor model.

16. The programmed computer of claim 15, wherein said transistor model is adjusted by adding said second gate CD offset to said I-V and C-V gate length parameters in said transistor model.

17. The programmed computer of claim 14, wherein said measured data from said test circuit is determined by measuring a delay corresponding to a power supply current of said ring oscillator.

18. The programmed computer of claim 13, wherein said normalized channel current is determined by dividing a source off-current by a gate width.

19. The programmed computer of claim 13, wherein said transistor model is adjusted by adding said first gate CD offset to a C-V gate length parameter in said transistor model.

20. The programmed computer of claim 13, wherein said test circuit comprises a ring oscillator.

21. The programmed computer of claim 13, wherein said transistor model is a FET model.

22. The programmed computer of claim 21, wherein said FET model is a SPICE MOSFET model.

* * * * *